United States Patent
Kosaka et al.

(10) Patent No.: US 8,757,816 B2
(45) Date of Patent: Jun. 24, 2014

(54) LASER PROJECTOR AND METHOD OF SCANNING LASER BEAM

(75) Inventors: Tadayoshi Kosaka, Yokohama (JP); Satoshi Ouchi, Kamakura (JP); Yoshiho Seo, Yokohama (JP); Tomoki Kobori, Kamakura (JP)

(73) Assignee: Hitachi Consumer Electronics Co., Ltd., Tokyo (JP)

( * ) Notice: Subject to any disclaimer, the term of this patent is extended or adjusted under 35 U.S.C. 154(b) by 443 days.

(21) Appl. No.: 13/247,445

(22) Filed: Sep. 28, 2011

(65) Prior Publication Data

US 2012/0082177 A1    Apr. 5, 2012

(30) Foreign Application Priority Data

Oct. 4, 2010 (JP) ................................. 2010-224470

(51) Int. Cl.
*G02B 27/48*    (2006.01)

(52) U.S. Cl.
CPC ..................................... *G02B 27/48* (2013.01)
USPC ........................................... 353/94; 353/122

(58) Field of Classification Search
CPC . H04N 9/3129; H04N 9/3132; H04N 9/3135; H01S 5/4093; H01S 5/0071; G03H 1/32; G03F 7/70583; G02B 27/48
USPC ........... 353/20, 31, 33, 75, 77, 78, 81, 84, 94, 353/97, 98, 99; 348/201, 206, 210.99, 266; 372/19, 29.02
See application file for complete search history.

(56) References Cited

U.S. PATENT DOCUMENTS

| | | | | |
|---|---|---|---|---|
| 7,370,972 B2 * | 5/2008 | Morikawa et al. | ............... | 353/20 |
| 7,679,799 B2 * | 3/2010 | Kasazumi et al. | ......... | 359/201.1 |
| 8,308,302 B2 * | 11/2012 | Lescure et al. | .................. | 353/31 |
| 2006/0018025 A1 | 1/2006 | Sharon et al. | | |
| 2007/0153235 A1 * | 7/2007 | Morikawa et al. | ............... | 353/20 |
| 2008/0049284 A1 * | 2/2008 | Park et al. | ..................... | 359/196 |
| 2008/0170285 A1 * | 7/2008 | Kasazumi et al. | ............ | 359/223 |
| 2008/0316373 A1 * | 12/2008 | Hishida | ......................... | 348/744 |
| 2010/0315597 A1 * | 12/2010 | Powell et al. | .................. | 353/20 |
| 2012/0013852 A1 * | 1/2012 | Champion et al. | .............. | 353/31 |
| 2012/0013855 A1 * | 1/2012 | Lescure et al. | .................. | 353/81 |

FOREIGN PATENT DOCUMENTS

| | | |
|---|---|---|
| GB | 1 363 029 A | 8/1974 |
| JP | 48 44087 A | 6/1973 |
| JP | 06-208089 | 7/1994 |
| JP | 2003-021800 | 1/2003 |
| JP | 2006-513447 A | 4/2006 |
| JP | 2007-163702 | 6/2007 |
| WO | WO 2005/078519 A1 | 8/2005 |

OTHER PUBLICATIONS

Office Action issued in Japanese Patent Application No. 2010-224470 issued on Nov. 12, 2013.

* cited by examiner

*Primary Examiner* — Francis M Legasse, Jr.
*Assistant Examiner* — Bao-Luan Le
(74) *Attorney, Agent, or Firm* — McDermott Will & Emery LLP (57) ABSTRACT

A laser projector for scanning a laser beam output by a multimode laser light source and displaying an image includes a laser driving unit to drive the multimode laser light source so that two-dimensional output patterns of a shape of the laser beam are different in each display frame. The laser driving unit applies to the multimode laser light source a driving waveform pattern which has the same product of an output intensity and output time of a laser light source during a display time of one dot and which includes an output intensity and output time different in each display frame.

9 Claims, 8 Drawing Sheets

FIG. 3A
LASER OUTPUT
TWO-DIMENSIONAL
PATTERN

TEM 00

FIG. 3B
LASER OUTPUT
TWO-DIMENSIONAL
PATTERN

TEM 01

FIG. 3C
LASER OUTPUT TWO-DIMENSIONAL PATTERN

TEM 10

FIG. 3D
LASER OUTPUT TWO-DIMENSIONAL PATTERN

TEM 11

FIG. 4

|  | OUTPUT INTENSITY | TIME | ONE DOT INTENSITY |
|---|---|---|---|
| PATTERN 1 | 1.0 | 0.1 | 1.0 |
| PATTERN 2 | 0.8 | 0.125 | 1.0 |
| PATTERN 3 | 0.5 | 0.2 | 1.0 |
| PATTERN 4 | 0.2 | 0.5 | 1.0 |
| PATTERN 5 | 0.1 | 1.0 | 1.0 |

FIG. 5A

OUTPUT INTENSITY AND OUTPUT TIME IN DISPLAY FRAME n

FIG. 5B

OUTPUT INTENSITY AND OUTPUT TIME IN DISPLAY FRAME n+1

FIG. 5C

OUTPUT INTENSITY AND OUTPUT TIME IN DISPLAY FRAME n+2

FIG. 6

OUTPUT INTENSITY AND OUTPUT TIME IN DISPLAY FRAME n

FIG. 7A

OUTPUT INTENSITY AND OUTPUT TIME IN DISPLAY FRAME n

FIG. 7B
OUTPUT INTENSITY AND OUTPUT TIME IN DISPLAY FRAME n+1

FIG. 7C
OUTPUT INTENSITY AND OUTPUT TIME IN DISPLAY FRAME n+2

FIG. 8

LASER PROJECTOR AND METHOD OF SCANNING LASER BEAM

CROSS REFERENCE TO RELATED APPLICATION

This application claims priority from Japanese Patent application JP2010-224470 filed on Oct. 4, 2010, the content of which is hereby incorporated by reference into this application.

BACKGROUND OF THE INVENTION

The present invention relates to a display device which scans modulated light from a coherent light source according to an image signal and displays an image, and further, to a technology of reducing speckle noise during display.

Figure 1A:
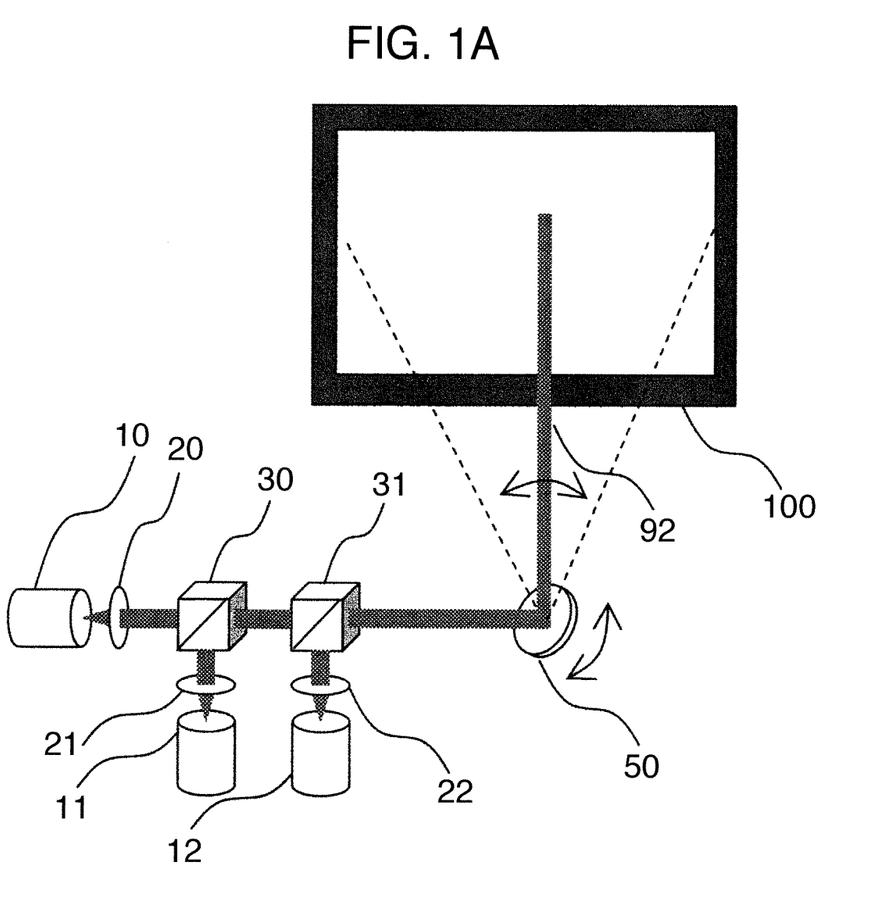
FIG. 1A illustrates the entire configuration of a display device.

As illustrated in FIG. 1A, for example, a laser projector has a configuration in which light from laser light emitting elements 10, 11, and 12 of three colors is approximately shaped into parallel light by collimate lenses 20, 21, and 22, reflected by a mirror 50 to be operated, and displays an image on a screen 100. JP-A-2003-021800 discloses a display device with the same configuration. A problem is well-known that in such a display using laser light with a high coherent property, a speckle phenomenon in which speckle patterns are generated at random is caused, and display quality is reduced.

For the purpose of reducing such a speckle phenomenon, examples include a method of mechanically vibrating an optical path as illustrated in WO 2005/078519 A1. However, there is a problem that since a frequency is short to sufficiently reduce speckles, an effect is small.

In addition to a method of operating light, a method of expanding and projecting an image modulated by a light modulation device according to image information is also proposed as illustrated in JP-A-06-208089. In the same manner, speckles are generated as a problem even in this method. With regard to the above, in JP-A-2007-163702, a speckle canceller is proposed in which a liquid crystal is sealed between a pair of transparent substrates.

SUMMARY OF THE INVENTION

Figure 2:
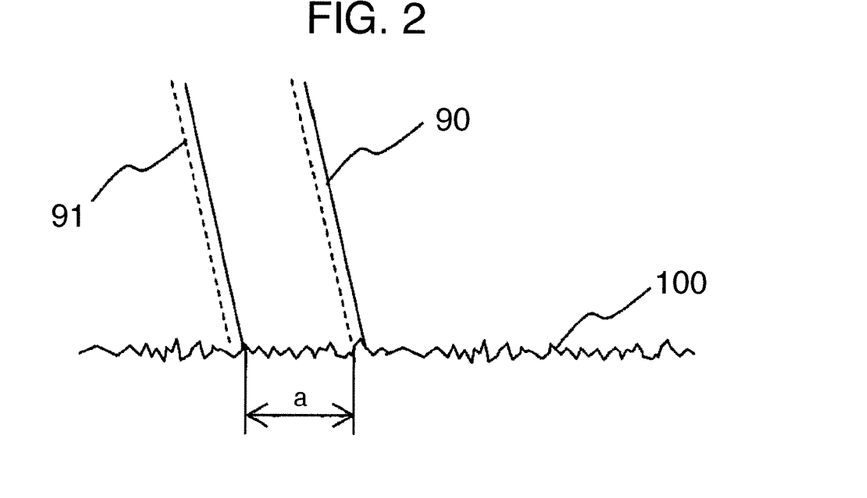
FIG. 2 is an enlarged sectional view of a beam and a screen in the case of fluctuating the beam.
Figure 3A:
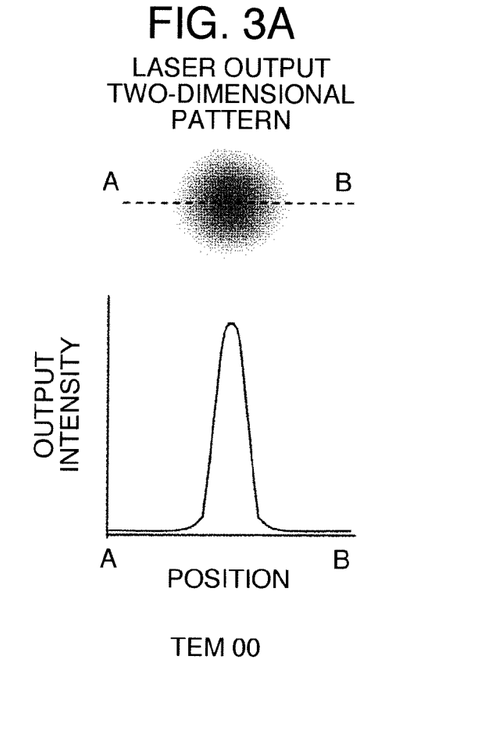
FIG. 3A illustrates an example of a two-dimensional output profile (TEM00) of a multimode LD.
Figure 3B:
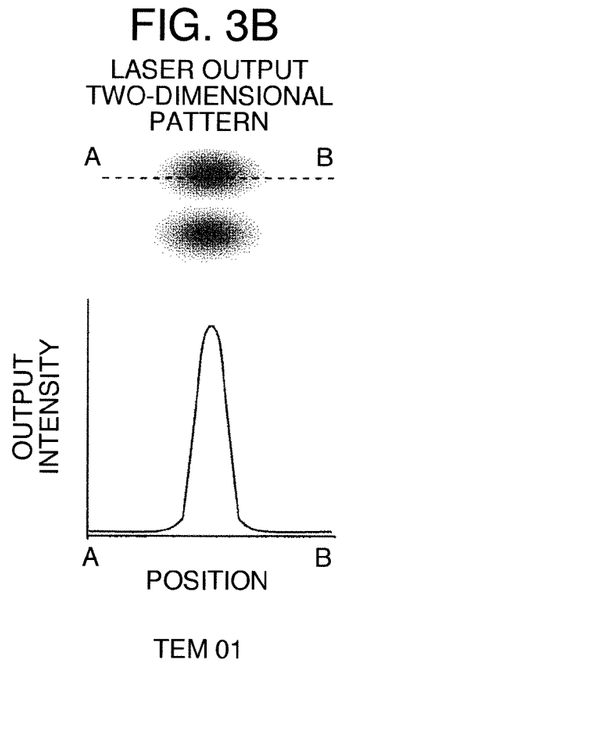
FIG. 3B illustrates an example of a two-dimensional output profile (TEM01) of a multimode LD.
Figure 3C:
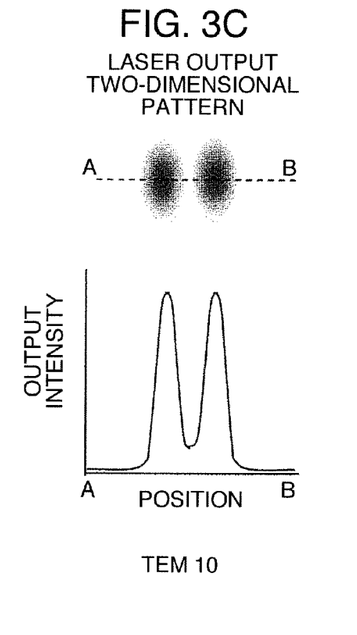
FIG. 3C illustrates an example of a two-dimensional output profile (TEM10) of a multimode LD.
Figure 3D:
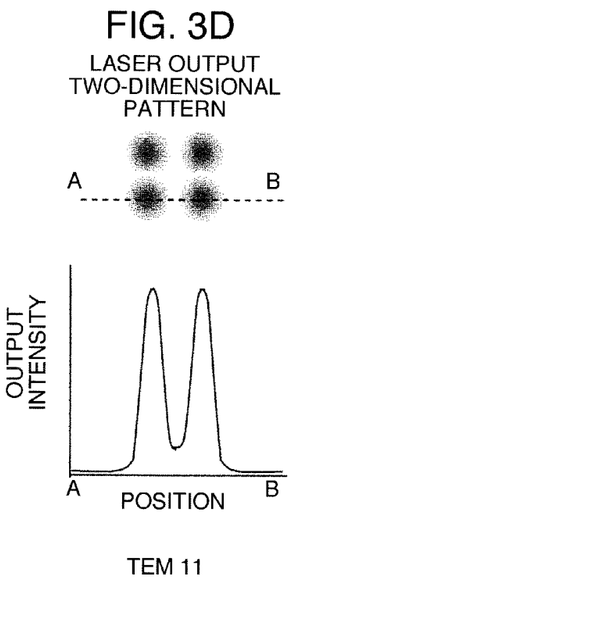
FIG. 3D illustrates an example of a two-dimensional output profile (TEM11) of a multimode LD.

In FIG. 2, an enlarged sectional view of a laser beam and screen in the case of fluctuating all laser beams is illustrated in the same manner as in WO 2005/078519 A1. In this case, there are generated speckles in which irregularities on a screen are reflected in the range in which one beam 90 is projected on a screen 100. A beam 90 before the fluctuation and a beam 91 after the fluctuation are deviated in a projection range on the screen 100, and superposed as much as a length a. At this time, a shape of the irregularities is not changed in the range of a, and therefore, the speckles also are not changed. Specifically, in a method disclosed in WO 2005/078519 A1, as amplitude due to the fluctuation is larger and superposition of the beams before and after the fluctuation is smaller, a speckle reduction effect is largely exerted. However, at the same time, there is a problem of large blurring of an image as side effects.

It is an object of the present invention to provide a laser projector capable of reducing speckle noise and performing displaying with high quality.

To solve the above-described problem, a laser projector which scans a laser beam output by a multimode laser light source of the present invention and displays an image includes a laser driving unit which drives the multimode laser light source so that two-dimensional output patterns of a shape of the laser beam are different in each display frame.

More specifically, the laser driving unit applies to the multimode laser light source a driving waveform pattern which has the same product of an output intensity and output time of a laser light source during a display time of one dot and which includes an output intensity and output time different in each display frame.

According to the present invention, when a speckle pattern is changed in terms of time, it is time-integrated and speckle noise can be apparently-reduced in human recognition. As a result, the displaying with high quality can be performed.

Other objects, features and advantages of the invention will become apparent from the following description of the embodiments of the invention taken in conjunction with the accompanying drawings.

DESCRIPTION OF THE EMBODIMENTS

In general, it is said that output of a multimode laser diode (LD) is unstable not only with respect to a wavelength but also with respect to a light emission profile. FIGS. 3A to 3D illustrate shape examples of light intensity distributions of several beam cross-sections which appear depending on output intensities. Here, with respect to TEMxy in FIGS. 3A-3D, the numbers x and y represent the number(s) of small node(s) of the intensity in the X and Y directions, respectively. The shapes of beam cross-sections are different depending on the output intensity, and further transiently change until a certain output is supplied.

In the present embodiment, to obtain the same luminance by using a multimode LD having an unstable output beam shape, multiple combinations of different output intensities and output times are changed in units of frame or one dot display time to drive the LD. As a result, the laser beam shape is changed, and interference of reflected light from each part is time-averaged to reduce speckles. More details will be described below.

Figure 4:
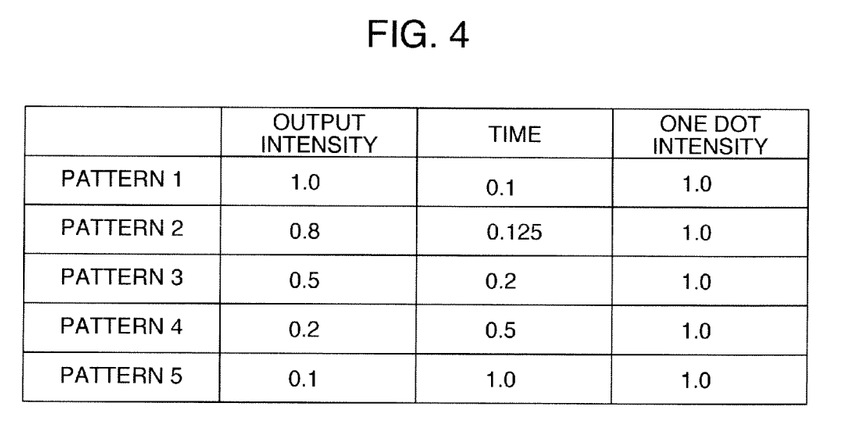
FIG. 4 illustrates an example of a combination of an instantaneous output and time to obtain the same intensity.

FIG. 4 illustrates an example of the time and instantaneous output intensity to obtain the same output intensity 1 at the time of displaying one dot. The time 10 in the figure is equivalent to the display time of one dot. Since the output intensity is represented as a product of the instantaneous output intensity and the time, a laser beam may be output for a short time in the case where the output intensity is strong or a laser beam may be output for a long time in the case where the output intensity is weak. Since different two-dimensional output patterns are caused by respective intensities, respective speckle patterns which appear are different.

For example, when the above-described combination is changed frame by frame, a laser output pattern changes frame by frame. Therefore, when the speckle patterns are time-averaged, speckle noise is viewed to be reduced in human recognition.

Further, in a case of a moving image, since the time-average can not be made on the laser output patterns among different frames, a speckle reduction effect is small. Therefore, when a two-dimensional output pattern is changed while a laser beam scans one dot, a speckle reduction effect is large. The embodiments of the present invention will be described in detail below with reference to the drawings.

A configuration of a laser projector of the present invention except for a laser driving circuit is similar to the structure shown in FIG. 1A. In the first embodiment, for example, a laser beam emitted from a green laser 10 driven by the laser driving circuit is shaped into an approximate parallel laser beam by a collimate lens 20. The green parallel laser beam passes through dichroic prisms 30 and 31. The green laser beam is then reflected by an operating mirror 50, so that a green image is displayed on a screen 100.

In the same manner, a laser beam emitted from a red laser 11 is shaped into an approximate parallel laser beam by a collimate lens 21. The red parallel laser beam is reflected by the dichroic prism 30, and then passes through the dichroic prism 31. The red laser beam is reflected by the operating mirror 50, so that a red image is displayed on the screen 100.

Further, a laser beam emitted from a blue laser 12 is shaped into an approximate parallel laser beam by a collimate lens 22, and then reflected by the dichroic prism 31 and the operating mirror 50, so that a blue image is displayed on the screen 100.

Figure 1B:
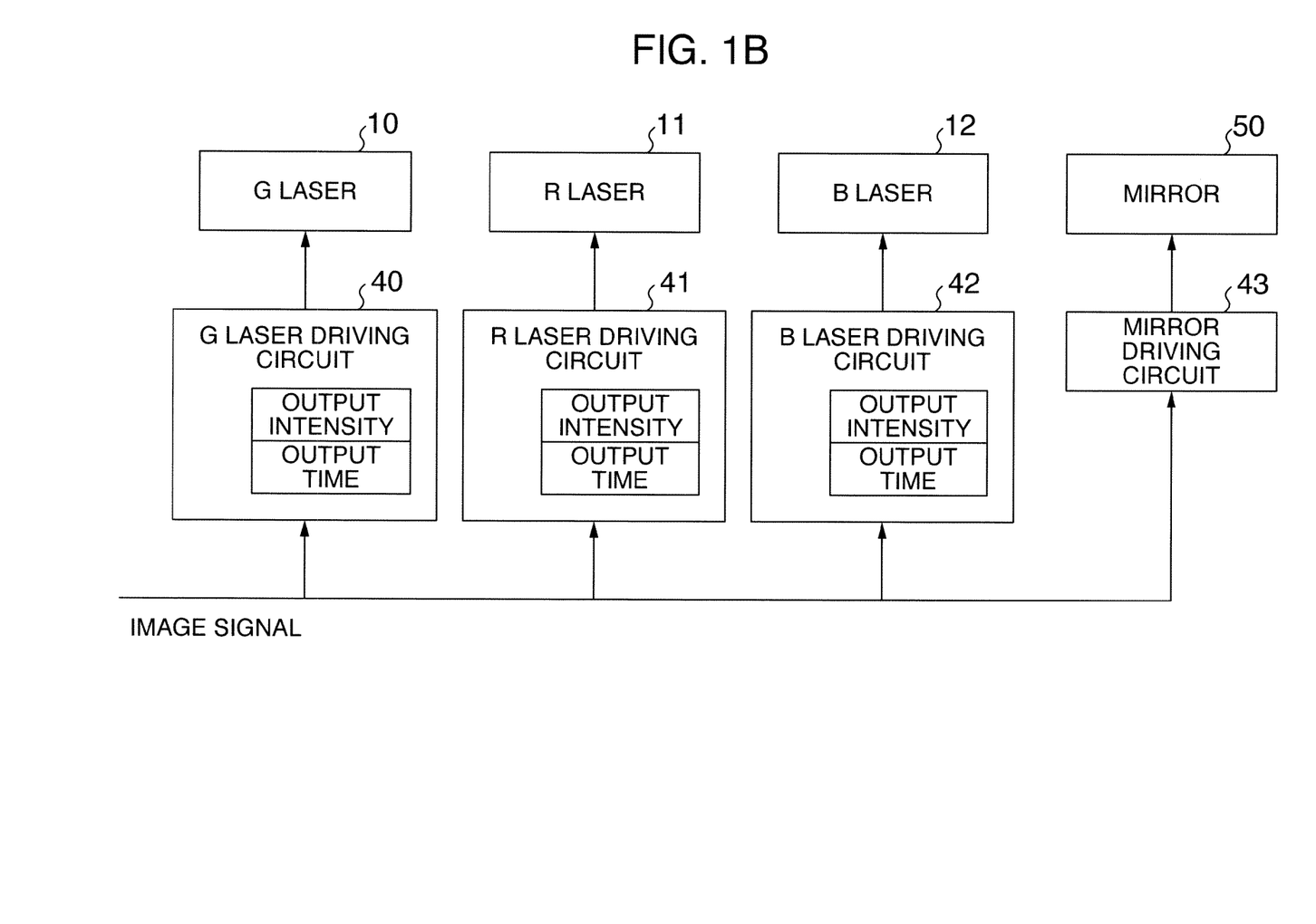
FIG. 1B is a block diagram illustrating a configuration of a laser driving circuit according to an embodiment of the present invention.
Figure 5A:
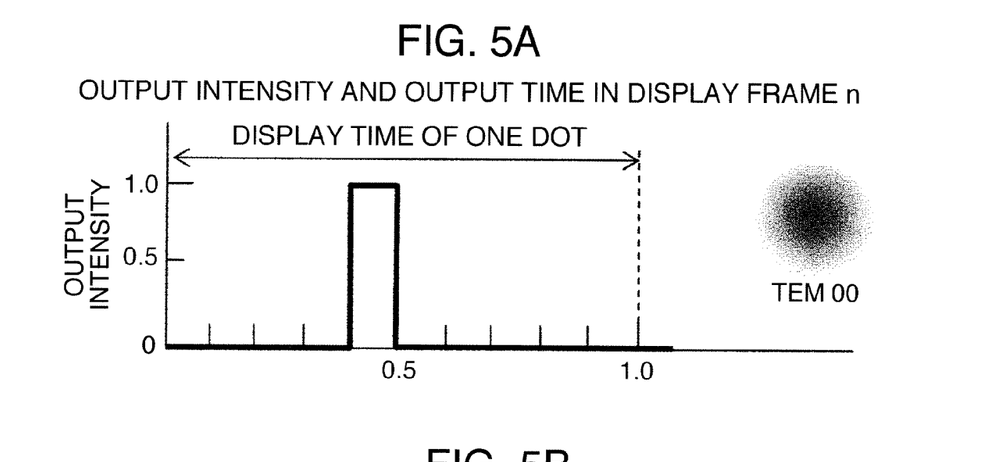
FIGS. 5A to 5C illustrate explanatory drawings of waveforms of a first embodiment.
Figure 5B:
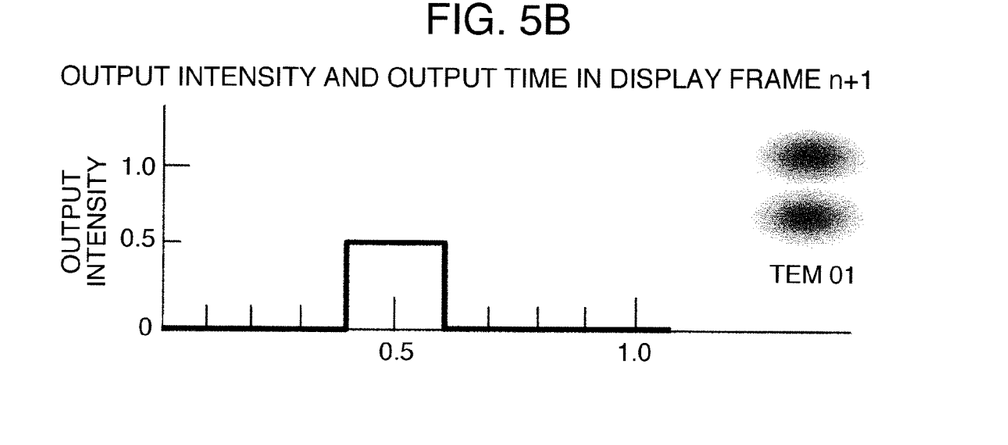
Figure 5C:
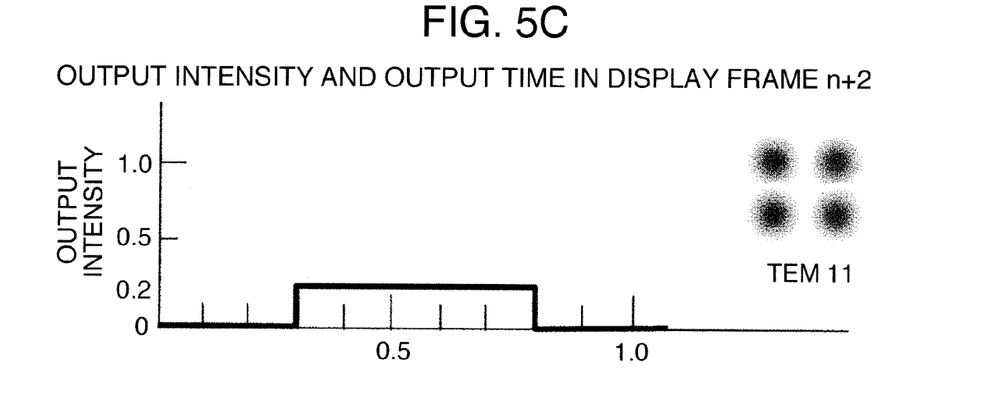

Next, a configuration and control method of the laser driving circuit will be described in more detail with reference to FIG. 1B. FIG. 1B illustrates one example of a circuit block configuration according to the embodiment of the laser driving circuit of the present invention. The above-described green laser 10, red laser 11, and blue laser 12 are controlled by a G laser driving circuit 40, an R laser driving circuit 41, and a B laser driving circuit 42, respectively. A detail of the control method will be described later. The laser driving circuits control the respective lasers so that the lasers operate in multimode light emission every frame unit or one dot unit of an image based on image signals. At this time, a laser beam shape is determined in each mode by setting of the output intensity and output time of the laser driving circuit. The mirror 50 which scans the laser beams on the screen 100 is controlled by a mirror driving circuit 43 synchronized with the image signals. FIGS. 5A to 5C illustrate a laser output corresponding to one pixel (dot) of the green laser 10 in each frame. In the laser output, one tenth of the display time of one dot is set as one unit, and the instantaneous output intensity of laser is controlled in units of 0.1. As previously described, since the laser output intensity of one dot is represented as a product of the instantaneous output intensity and the time, the laser output intensity corresponds to an area of the output signal shown in FIGS. 5A-5C.

FIG. 5A illustrates a drive state of the laser in the case where a laser beam is output by for one tenth of the display time for one dot with respect to the output intensity 1 in the display frame n (n is a frame number). At this time, a shape of the laser beam is, for example, that of TEM00 and an intensity of one dot is equal to 1.

FIG. 5B illustrates a drive state of the laser in the case where a laser beam is output by for two-tenths of the display time for one dot with respect to the output intensity 0.5 in the display frame n+1. At this time, a shape of the laser beam is, for example, that of TEM01 and an intensity of one dot is equal to 1.

FIG. 5C illustrates a drive state of the laser in the case where a laser beam is output by for five-tenths of the display time for one dot with respect to the output intensity 0.2 in the display frame n+2. At this time, a shape of the laser beam is, for example, that of TEM11 and an intensity of one dot is equal to 1.

As illustrated in FIGS. 5A, 5B, and 5C, when a drive waveform of laser is changed for each frame to drive the same laser output, a two-dimensional profile of the frame beam changes for each frame. Since speckle patterns are different in each two-dimensional profile, the speckle patterns generated in each frame are integrated in terms of time, and speckle noise is reduced in recognition of an observer.

The laser driving circuit stores laser driving patterns for frames as a format illustrated in FIG. 4, switches over the pattern for each frame, and drive the laser according to the pattern.

A second embodiment will be described with reference to FIG. 6. In the present embodiment, the intensity of the laser driving pattern of the previously described first embodiment is changed during the display time of one dot. Specifically, in the case of an example illustrated in FIG. 6, a laser beam is output for the time 0.05 of one dot with respect to the output intensity 1, and then output for the time 0.1 of one dot with respect to the output intensity 0.5. At this time, the beam shape is first the TEM00, and then changes into the TEM01. The speckle pattern changes in each luminescence period. Therefore, the speckle pattern is time-integrated, and the speckle is reduced in human recognition.

Figure 6:
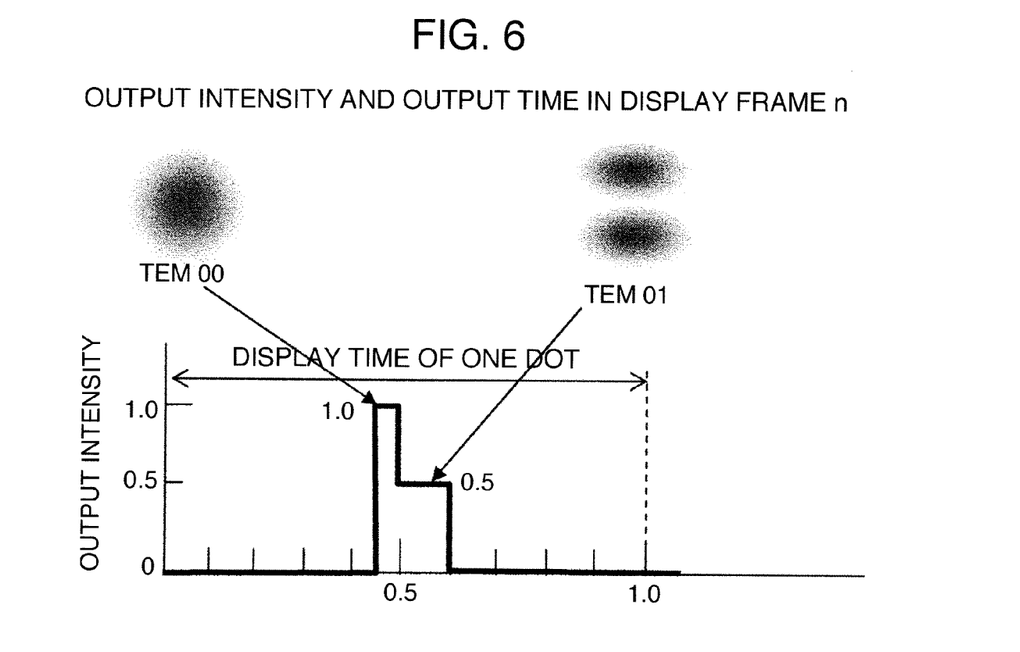
FIG. 6 illustrates an explanatory drawing of waveform of a second embodiment.

In FIG. 6, only one laser driving pattern is illustrated. In the same manner as in the first embodiment, the laser may be driven by using a pattern different in each frame. In that case, the laser driving circuit may store laser driving patterns for frames, switches over the pattern for each frame, and drives the laser according to the pattern.

In the case of the present embodiment, a center of gravity of the laser driving pattern is preferably positioned near a center of the display time of one dot.

In the case of the present embodiment, there is also the possibility that an unexpected beam shape appears in a transition period in which the output intensity is changed, and in that case, more effective speckle reduction can be obtained.

A third embodiment will be described with reference to FIG. 7. In the same manner as in the laser driving pattern of the previously described second embodiment, in the present embodiment, the intensity is changed during the display time of one dot.

Figure 7A:
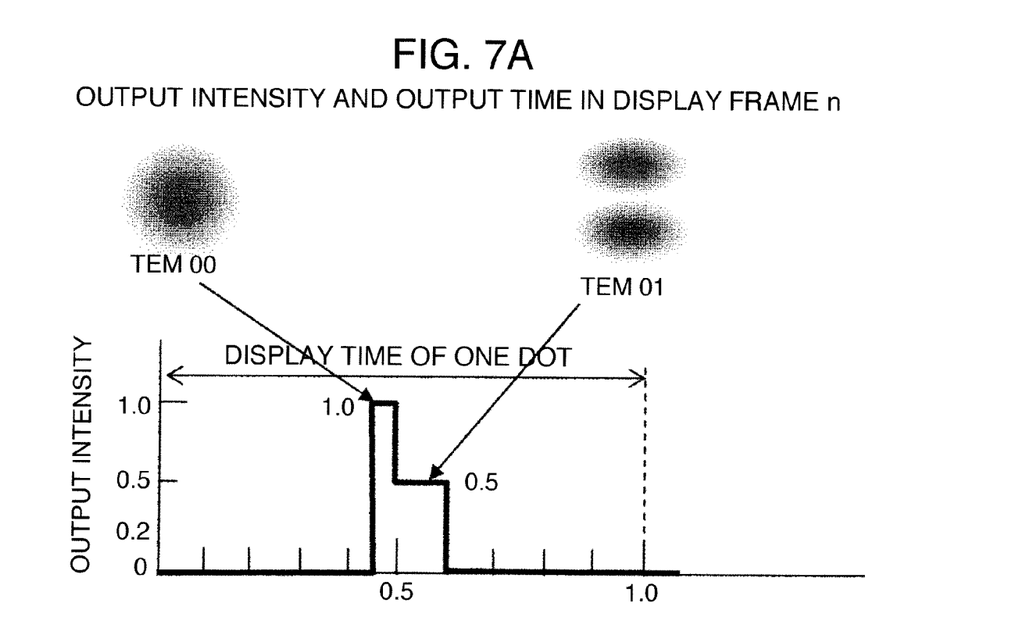
FIGS. 7A to 7C illustrate explanatory drawings of waveforms of a third embodiment.

Specifically, as illustrated in FIG. 7A, in the display frame n, a laser beam is output for the time 0.05 of one dot with respect to the output intensity 1, and then output for the time 0.1 of one dot with respect to the output intensity 0.5. At this time, the beam shape is first the TEM00, and then changes into the TEM01.

Figure 7B:
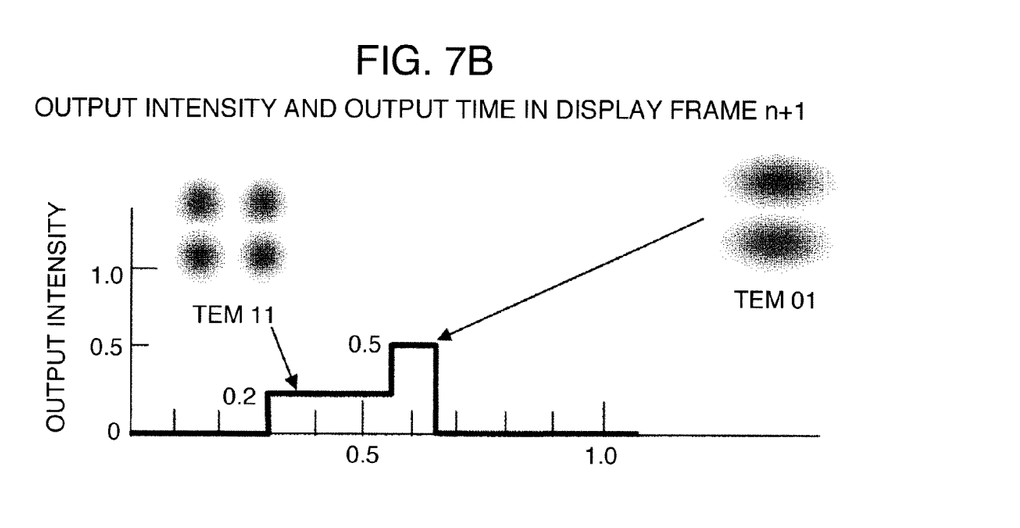

Next, as illustrated in FIG. 7B, in the display frame n+1, a laser beam is output for the time 0.25 of one dot with respect to the output intensity 0.2, and then output for the time 0.1 of one dot with respect to the output intensity 0.5. At this time, the beam shape is first the TEM11, and then changes into the TEM01.

Figure 7C:
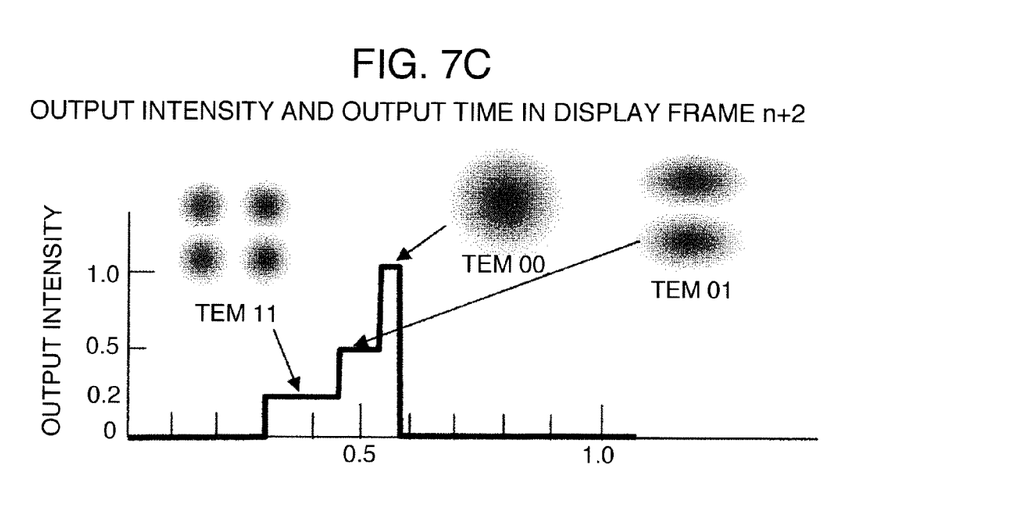

Next, as illustrated in FIG. 7C, in the display frame n+2, a laser beam is output for the time 0.17 of one dot with respect to the output intensity 0.2, and then output for the time 0.67 of one dot with respect to the output intensity 0.5. Further, a laser beam is then output for the time 0.3 of one dot with respect to the output intensity 1. At this time, the beam shape is first the TEM11, then changes into the TEM01, and finally changes into the TEM00. Each speckle pattern is changed. Therefore, the speckle pattern is time-integrated, and the speckle is reduced in human recognition.

As described above, the laser driving pattern may be formed even in the direction of increasing or decreasing the instantaneous output intensity of laser. Also, the number of stages is not limited to two stages or three stages of the figures.

Further, in the case of the present embodiment, a center of gravity of the laser driving pattern is preferably positioned near a center of the display time of one dot.

In the case of the present embodiment, there is also the possibility that an unexpected beam shape appears in a transition period in which the output intensity is changed, and in that case, the degree of speckle reduction can be raised.

Further, in the case of the present embodiment, there is also the possibility that an unexpected beam shape appears in a transition period in which the output intensity is changed, and in that case, more effective speckle reduction can be obtained.

Further, in the case of the present embodiment, since superposition in recognition of speckle patterns is performed also in each frame, the speckle reduction effect is higher.

A fourth embodiment will be described with reference to FIG. 8. A laser driving pattern according to the present embodiment is different from that of the previously described present embodiment, and a drive pulse is discretely applied during the display time of one dot.

Figure 8:
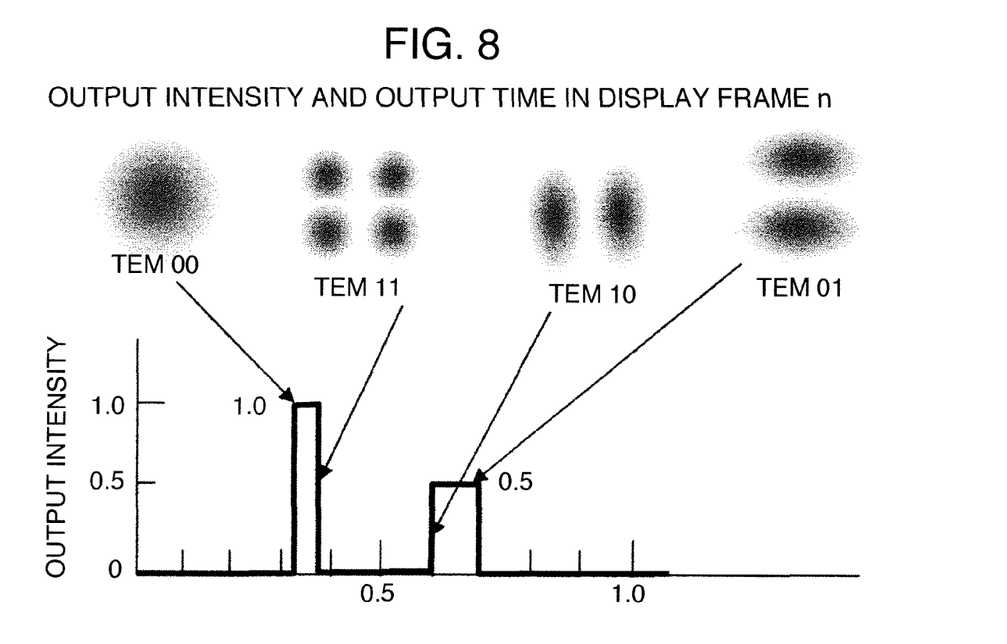
FIG. 8 illustrates an explanatory drawing of waveform of a fourth embodiment.

Specifically, in the case of an example illustrated in FIG. 8, in the display frame n, a laser beam is output for the time 0.05 of one dot with respect to the output intensity 1, and then the output of the laser beam is returned to 0. Next, the laser beam is output for the time 0.1 of one dot with respect to the output intensity 0.5. At this time, a beam shape is first the TEM00, and then changes into the TEM01.

Further, in the case of the present embodiment, the possibility that unexpected beam shapes (TEM11 and TEM10) appear in a transition period in which the output intensity is changed is larger than those of the other embodiments, and more effective speckle reduction can be obtained.

Also in the case of the present embodiment, the laser driving pattern is not limited to that of FIG. 8. Further, a center of gravity of the laser driving pattern is preferably positioned near a center of the display time of one dot.

The explanation about the first to fourth embodiments were made with respect to the green laser. Further, the same operation may be performed by using the red laser, the blue laser, or all the lasers.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method of scanning a laser beam of a laser projector for scanning a laser beam and displaying an image, comprising:
   causing a laser light source which outputs a laser beam to have a first output mode with one peak in a cross-sectional intensity distribution of a laser beam, a second output mode with two peaks in a cross-sectional intensity distribution of a laser beam, and a third output mode with four peaks in a cross-sectional intensity distribution of a laser beam; and
   causing a laser beam to be scanned in combination of any of a scanning timing for outputting a laser beam by the first output mode, a scanning timing for outputting a laser beam by the second output mode, and a scanning timing for outputting a laser beam by the third output mode.

2. The method according to claim 1, wherein:
   a laser beam is output with the first output mode in an n-th frame of an image, where n is a number of frame;
   a laser beam is output with the second output mode in an (n+1)-th frame of an image; and
   a laser beam is output with the third output mode in an (n+2)-th frame of an image.

3. The method according to claim 1,
   wherein during a display period of one dot, a laser light source is driven in combination of any of the first, second, and third output modes.

4. The method according to claim 1,
   wherein during the display period of one dot, a laser light source is discretely driven in combination of any of the first, second, and third output modes in order sandwiching therebetween a timing at which a laser light source is not driven.

5. The method according to claim 2,
   wherein in the first, second, and third output modes, drive states of a laser light source are different.

6. The method according to claim 3,
   wherein a center of gravity of a drive waveform for driving the laser light source is positioned in a central part of the display time of one dot.

7. The method according to claim 3,
   wherein output modes of laser light sources combined during the display period of one dot are different in frames with different images.

8. The method according to claim 5, wherein:
   in the first output mode, a laser light source is driven by one tenth of a display time of one dot with respect to output intensity 1;
   in the second output mode, a laser light source is driven by two-tenths of a display time of one dot with respect to output intensity 0.5; and
   in the third output mode, a laser light source is driven by five-tenths of a display time of one dot with respect to output intensity 0.2.

9. The method according to claim 7, wherein:
   in the n-th frame of an image, n being a number of the frame, a laser light source is driven in combination of the first and second output modes in order;
   in the (n+1)-th frame of an image, a laser light source is driven in combination of the second and third output modes in order; and
   in the (n+2)-th frame of an image, a laser light source is driven in combination of the third, first, and second output modes in order.

* * * * *